(12) United States Patent
Watanabe et al.

(10) Patent No.: US 7,435,970 B2
(45) Date of Patent: Oct. 14, 2008

(54) BEAM CURRENT METER

(75) Inventors: Tamaki Watanabe, Wako (JP); Takeshi Katayama, Wako (JP); Masayuki Kase, Wako (JP); Tokihiro Ikeda, Wako (JP); Shin-ichi Watanabe, Tokyo (JP); Takeo Kawaguchi, Kakogawa (JP)

(73) Assignee: Riken, Saitama (JP)

( * ) Notice: Subject to any disclaimer, the term of this patent is extended or adjusted under 35 U.S.C. 154(b) by 222 days.

(21) Appl. No.: 10/558,419

(22) PCT Filed: May 28, 2004

(86) PCT No.: PCT/JP2004/007346

§ 371 (c)(1),
(2), (4) Date: Aug. 31, 2006

(87) PCT Pub. No.: WO2004/107463

PCT Pub. Date: Dec. 9, 2004

(65) Prior Publication Data

US 2007/0069722 A1 Mar. 29, 2007

(30) Foreign Application Priority Data

May 30, 2003 (JP) ............................... 2003-155407

(51) Int. Cl.
*G01R 33/02* (2006.01)
*H01L 39/00* (2006.01)
*H01F 6/06* (2006.01)

(52) U.S. Cl. ...................... 250/397; 250/283; 250/286; 324/71.3; 324/248

(58) Field of Classification Search ................. 250/397, 250/283, 286; 324/71.3, 248
See application file for complete search history.

(56) References Cited

U.S. PATENT DOCUMENTS 4,687,987 A * 8/1987 Kuchnir et al. ............. 324/71.3

5,166,777 A 11/1992 Kataoka
2007/0229057 A1 * 10/2007 Watanabe et al. ......... 324/117 R

FOREIGN PATENT DOCUMENTS

JP 64-18280 A 1/1989

(Continued)

OTHER PUBLICATIONS

K. Grohmann et al., "A Cryodevice for induction monitoring of DC electron or ion beams with nano-ampere resolution", Superconducting Quantum Interference Devices and Their Applications, 1977, p. 311-315.

(Continued)

*Primary Examiner*—Nikita Wells
(74) *Attorney, Agent, or Firm*—Birch, Stewart, Kolasch & Birch, LLP.

(57) ABSTRACT

It is possible to simplify the cooling mechanism of a superconductor, significantly reduce the cost, simplify the measurement work, and reduce the time required for measurement. A beam current meter includes: a cylindrical super conductor beam current sensor arranged in a vacuum vessel in such a manner that the beam incoming into the vacuum vessel is guided to pass through a bore of the vacuum vessel and a bridge portion is formed at the outer diameter, a SQUID arranged at the bridge portion of the beam current sensor; a cylindrical superconductor magnetic shield arranged so as to surround the external diameter side of the beam current sensor in such a manner that the SQUID is positioned between the beam current sensor and the magnetic shield, so that a beam is guided to pass through the bore of the beam current sensor, thereby measuring the beam the beam current of the beam. The beam current meter uses a freezing device as cooling means for cooling the beam current sensor, the SQUID, and the magnetic shield.

6 Claims, 15 Drawing Sheets

FOREIGN PATENT DOCUMENTS

| | | |
|---|---|---|
| JP | 7-135099 A | 5/1995 |
| JP | 2000-275289 A | 10/2000 |
| JP | 2001-66351 A | 3/2001 |
| JP | 2003-21670 A | 1/2003 |

OTHER PUBLICATIONS

M. Kuchnir et al., "Sqid Based Beam Current Meter", IEEE Transactions on Magnetics, vol. Mag-21, No. 2, 1985, pp. 997-999.

Andreas Peters et al., "A Cryogenic Current Comparator for the absolute measurement of nA beams", AIP Conf. Proc. 451 (Beam Instrumentation Workshop), 1998, p. 163.

L. Hao et al., "Design and performance of an HTS current comparator for charged-particle-beam measurements", IEEE Transactions on Applied Superconductivity, vol. 11, No. 1, 2001, pp. 635-638.

Nippon Butsuri Gakkai Shi, vol. 54, No. 1, 1999, pp. 34-40, with English Translation.

* cited by examiner

FIG. 11

OUTPUT

FEEDBACK

SYNCHRONOUS DETECTOR

MODULATION OSCILLATOR

AC AMPLIFIER

FEEDBACK COIL

MODULATION COIL

SQUID

PICKUP COIL

INPUT COIL

B

DC

LOW TEMPERATURE SECTION

BEAM CURRENT METER

TECHNICAL FIELD

The present invention relates to a beam current meter, and more particularly to a beam current meter with which a faint beam current can be measured without damaging it and with a high degree of accuracy.

BACKGROUND TECHNOLOGY

Heretofore, a DCCT (DC Current Transformer) of a magnetic modulation type is known, for example, as a beam current meter.

In this respect, however, the lower limit for measuring an electric current is in an order of several µA in a conventional DCCT of the magnetic modulation type, so that there is such a problem that a faint beam current of around several nA cannot be measured.

In order to solve such problem as described above, a beam current meter composed of a SQUID (Superconducting Quantum Interference Device) used for measuring a magnetic field produced by a brain or a heart and a magnetic shield of a superconductor operated at a liquid helium temperature has been developed by German GSI (Geselshaft fur Schwerionenforschung), Institute for Nuclear Study (INS), University of Tokyo (now High Energy Accelerator Research Organization, KEK), or Research Center for Nuclear Physics, Osaka University as a beam current meter which can measure a faint beam current of an around several nA order (see non-patent literary documents 1 to 5).

When a beam current meter with which a faint beam current of around several nA can be measured is compared with a conventional beam current meter with which a beam current of an order of several µA is measured, the former beam current meter has 1000 times higher sensitivity than that of the latter beam current meter. In a comparison of specific magnetic fields, earth magnetism is $10^{-5}$ T, while cerebric magnetic field is $10^{-15}$ T wherein a point of 20 cm apart from the center of a magnetic field produced by beam of 1 nA is $10^{-15}$ T, so that a beam current meter which may measure a faint beam current of around several nA must measure a very faint magnetic field.

FIGS. 1 and 2 show schematic structural constitutions of a conventional beam current meter composed of the above-described SQUID and a superconductor magnetic shield which operates at liquid helium temperature. Namely, FIGS. 1 and 2 illustrate only a constitution of its machine construction to help understanding of the present invention, so that a variety of electrical connecting conditions, an electrical conductive state, and a detecting means for temperature and the like are not illustrated and they are omitted. FIG. 1 is a sectional view taken along the line A-A of FIG. 2, while FIG. 2 is a sectional view taken along the line B-B of FIG. 1.

In the description of the present specification and in the accompanying drawings, the same or corresponding components as or to other components are represented by the same reference character, whereby an overlapped description as to their constitutions and functions is omitted.

In FIGS. 1 and 2, reference numeral 1 designates a superconductor beam current sensor, reference character 2 designates a superconductor magnetic shield, reference character 3 designates a SQUID, reference character 4 designates a cooling medium tank, reference character 5 designates a vacuum vessel, reference character 6 designates an upper flange, reference character 7 designates a beam duct, reference character 8 designates a trestle, reference character 9 designates liquid helium being a cooling medium, reference character 10 designates a vacuum area in the vacuum vessel 5, and reference character 11 designates an atmospheric air area outside the vacuum vessel 5.

More specifically, the vacuum vessel 5 is constituted in such that a side of the upper surface 5a is closed by the upper flange 6, bores 5c for constituting beam ducts 7 are defined on a circumferential wall surface of the vacuum vessel at positions opposed to each other, and a side of the bottom surface 5b is supported on the trestle.

In the beam current meter, it is arranged in such that a beam is input from either of the bores 5c constituting either of the beam ducts 7, and the beam is output from the other bore 5c constituting the other beam duct 7.

In the vacuum vessel 5, a cylindrical beam current sensor 1 is arranged in such a manner that the beam incoming into the vacuum vessel 5 is guided to pass through a bore of the vacuum vessel, and the SQUID 3 is disposed on a side of the upper surface of the beam current sensor 1. Moreover, the cylindrical superconductor magnetic shield 2 is arranged so as to surround the external diameter side of the beam current sensor 1 in such a manner that the SQUID 3 is positioned between the beam current sensor 1 and the magnetic shield.

These above-described beam current sensor 1, SQUID 3, and magnetic shield 2 are arranged in the cooling medium tank 4 of a doughnut shape wherein the above-described respective components are arranged in such that a beam is guided to pass through a hollow region in the internal diameter side of the doughnut-shaped cooling medium tank 4.

The cooling medium tank 4 is filled with liquid helium being a cooling medium, whereby the beam current sensor 1, the SQUID 3, and the magnetic shield 2 disposed in the cooling medium tank are cooled to the liquid helium temperature.

In the above described constitution, the inside of the vacuum vessel 5 is maintained at $1 \times 10^{-4}$ Pa by means of vacuum equipment, and a beam is passed through the beam current meter. Namely, a beam is passed through the beam current meter in such a manner that the beam is input from either of the bores 5c constituting either of the beam ducts 7 and output from the other bore 5c constituting the other beam duct 7, whereby a beam current of the beam is measured.

Although such measuring principle of a beam current meter wherein the beam current sensor 1 and the SQUID 3 are used is a well-known technology, it will be simply described by referring to FIG. 3 for easy understanding of the invention according to this application.

FIG. 3 is a perspective explanatory view of a schematic constitution showing the beam current sensor 1 to which the SQUID 3 is attached.

The beam current sensor 1 is formed by winding circumferentially a linear insulating material around a surface of the external diameter side of a superconductor circumferential wall surface (in headband-like state) with leaving only a part of a region (bridge portion). The above-described insulating material is disposed circumferentially at the central position in the axial direction of the beam current sensor 1. Moreover, the SQUID 3 is disposed on the above-described bridge portion.

When a beam passes through a space on the internal diameter side of the beam current sensor 1, shield current flows on the surface of the superconductor based on Meissner effect. The shield current flows only through the bridge portion, whereby a magnetic field in an azimuthal direction is generated as a result of passage of an electric current.

Since the SQUID 3 is provided on the bridge portion, a magnetic field produced in the bridge portion as a result of the passage of an electric current may be measured at high sensitivity, so that when the magnetic field measured at high sensitivity is converted into an electric current value, a beam current can be measured in nondestructive and with a high degree of accuracy.

Namely, when the bridge portion is formed on the surface of a cylindrical superconductor, it becomes possible to concentrate efficiently a shield current.

In order to measure with a good SN ratio such magnetic field generated in an azimuthal direction on the bridge portion, it is preferred to use a SQUID gradiometer as the SQUID 3.

This is because the SQUID gradiometer contains right and left input coils for detecting a magnetic field as shown in FIG. 4. In this case, if there is a common mode noise magnetic field wherein magnitudes and directions of external noise magnetic fields are quite same with each other in the case when external noise magnetic fluxes are going to enter the right and left input coils, the external noise fluxes are completely cancelled. On one hand, a magnetic field produced in the bridge portion as a result of passage of a beam is an opposite phase magnetic field wherein magnitudes are the same, but directions are opposite to each other as described above. Thus, when the SQUID gradiometer is compared with a SQUID magnetometer wherein one input coil is usually used, the SQUID gradiometer can detect data at two times higher sensitivity than that of the SQUID magnetometer.

When a SQUID gradiometer is used as the SQUID 3, an external noise magnetic field can be remarkably reduced, a limit of sensitivity due to a conventional DCCT of magnetic modulation type comes to be improved remarkably as a result of an application of such superconductive technology.

Incidentally, although the SQUID 3 is used for high sensitization in the above-described beam current meter, signals required actually cannot be detected in the case where such signals get lost in noises from the outside, even if a how high sensitive sensor is used. For this reason, the superconductor magnetic shield 2 is arranged in the above-described conventional beam current meter.

Namely, when a magnetic field is applied to a superconductive material from the outside, an electric current flows on a surface of the superconductive material as a characteristic of superconductivity in such that the magnetic field is canceled due to Meissner effect. It has been widely known that a strong magnetic shield can be realized by applying the above-described effect.

Moreover, although a conventional magnetic shield surrounding a metal of a high magnetic permeability is effective in a high frequency magnetic field, the effect decreases significantly in a low frequency magnetic field. In case of a superconductor magnetic shield, there is a remarkable advantage to the effect that its efficiency of shield does not depend on a frequency.

The magnetic shield 2 may be prepared by calcining a bismuth-base superconductive material with a thickness of 300 microns on a cylindrical ceramics made from magnesium oxide having a purity of 99.9% or more. For the preparation of such magnetic shield, about four weeks of processes such as calcination, and compression are required.

For measuring the magnetic shield 2 prepared as described above, an X-Y stage driven by a stepping motor provided with a Helmholtz coil and a SQUID system for measuring magnetic field are fabricated, and measurement is conducted. Namely, as shown in FIG. 5, an external magnetic field is generated over the magnetic shield 2 by means of the Helmholtz coil, and a magnetic field probe provided with the SQUID 3 is driven between the magnetic shield 2 and the beam current sensor 1, whereby an attenuation factor of the magnetic field is measured.

FIG. 6 shows results of measuring attenuation factors in a magnetic field wherein a magnetic field of 3.5 μT is applied parallely to the magnetic shield 2 in 1 Hz cycle. In this case, a position 0 mm of the magnetic shield 2 represents the cylindrical center of the magnetic shield 2. An attenuation factor S(z) is defined by the following equation:

$$S(z)=B(z)/B_0$$

wherein $B_0$ represents a magnetic field produced by the Helmholtz coil, and B(z) represents a magnetic field at a position z of the magnetic probe in the magnetic shield 2.

From the measuring results, such result that the attenuation factor is $3\times10^{-4}$ at the center of the magnetic shield 2 was obtained in the case when a magnetic field is applied parallely to the magnetic shield 2.

However, a beam current meter wherein a superconductor operated at liquid helium temperature is used involves the following problems, because liquid helium is used as a cooling medium as described above. The specific problems are in that since liquid helium is used as a cooling medium, a cooling mechanism therefor becomes complicated, and in addition a cost therefor becomes expensive, because the liquid helium itself being a coolant (cooling medium) is not an inexpensive material.

Furthermore, there is another problem in that when liquid helium is replenished in case of using the liquid helium as a cooling medium, several hours are required until a SQUID is operated stably, so that such replenishing operation requires much labor hour and time.

In addition, there is a further problem in that beam current measurement with high sensitivity cannot be implemented in the above-described conventional magnetic shield in view of the attenuation factors in the measured results shown in FIG. 6 as described above.

Non-patent literary document 1: "A Cryodevice for induction monitoring of DC electron or ion beams with nano-ampere resolution", K. Grohmann, et al., Superconducting Quantum Interference Devices and Their Applications, 1977, p.311

Non-patent literary document 2: "SQUID" based beam current meter", IEEE Trans. on Magnetics, Vol. MAG-21, No. 2, 1985, p.997

Non-patent literary document 3: "A Cryogenic current comparator for the absolute measurement of nA beams", AIP Cof. Proc. 451 (Beam Instrumentation Workshop), 1998, p.163

Non-patent literary document 4: "Design and performance of an HTS current comparator for charged particle-beam measurements", L. Hao et al., IEEE Trans. on Appl. Supercond. (ASC2000), Vol. 11, No. 1, 201-3, p.635

Non-patent literary document 5: "TYOZOU RINNGU NIOKERU BIIMU DENRYUU NO KOUKANNDO SOKUTEI (High sensitive measurement of beam current in storage ring)", Tetsumi Tanabe, Megumi Shinada, Journal of Physical Society of Japan, Vol. 54, No. 1, 1999, p.34

DISCLOSURE OF THE INVENTION

Problems to be Solved by the Invention

The present invention has been made in view of the background of the invention, problems involved in the prior art, and demands for the prior art as described above, and an object thereof is to provide a beam current meter by which a cooling mechanism for a superconductor may be simplified, and in addition a remarkable reduction in the cost is possible.

Furthermore, another object of the present invention is to provide a beam current meter by which simplification of measuring operations is achieved, and in addition a reduction in a time required for measurement is achieved.

Moreover, a still further object of the present invention is to provide a beam current meter by which beam current measurement can be conducted at high sensitivity through sufficient shielding of an external magnetic field without affecting adversely by the external magnetic field.

Means for Solving the Problems

In order to achieve the above-described objects, a beam current sensor according to the present invention is arranged in such that a beam current sensor, a SQUID, and a magnetic shield are disposed in vacuum of a heat insulating vacuum vessel, and a freezing device is used as a cooling means for the beam current sensor, the SQUID, and the magnetic shield, whereby the beam current sensor, the SQUID, and the magnetic shield are cooled by heat conduction of heat conducting means such as a cold head, and a cold finger of the freezing device disposed inside the heat insulating vacuum vessel.

Thus, according to the beam current meter of the present invention, since there is no need of using a cooling medium such as liquid helium, and liquid nitrogen, the cooling mechanism is simplified, and it becomes possible to reduce remarkably the cost.

Moreover, since there is no need of replenishing a cooling medium such as liquid helium, and liquid nitrogen in a measurement work, the measurement work is simplified, besides the SQUID can be stably operated in a continuous manner, so that a measurement time can be reduced.

Furthermore, when a pulse tube refrigerator is used as the freezing device being a cooling means for the beam current meter according to the present invention, there is such an advantage that a mechanical vibration can be reduced, and noises in the beam current meter can be decreased, since a mechanical driving means is not in the cold head portion of the pulse tube refrigerator. Besides, the cooling mechanism is simplified, the maintenance becomes easy, and in addition, it is possible to reduce remarkably the cost.

Further, when liquid nitrogen is used as a cooling medium, there is such a possibility that liquid nitrogen contains liquid oxygen and in this respect, since liquid oxygen has magnetism, it may be a noise source. It is to be noted, however, that there is no need for taking a countermeasure against noise generation due to use of liquid nitrogen in the beam current meter according to the present invention wherein no liquid nitrogen is used.

Besides, a magnetic shield is constituted into a multilayered structure in the present invention, thereby shielding sufficiently an external magnetic field, so that beam current measurement with high sensitivity is carried out without affecting adversely by the external magnetic field.

Namely, the present invention relates to a beam current meter including a cylindrical superconductor beam current sensor arranged in a vacuum vessel in such a manner that the beam incoming into the vacuum vessel is guided to pass through a bore of the vacuum vessel and a bridge portion is formed at the outer diameter; a SQUID arranged at the bridge portion of the beam current sensor; a cylindrical superconductor magnetic shield arranged so as to surround the external diameter side of the beam current sensor in such a manner that the SQUID is positioned between the beam current sensor and the magnetic shield, so that a beam is guided to pass through the bore of the beam current sensor, thereby measuring the beam current of the beam. The beam current meter uses a freezing device as cooling means for cooling the beam current sensor, the SQUID, and the magnetic shield.

In the beam current meter of the invention, the freezing device is provided with a heat conducting means disposed in the vacuum vessel, and the beam current sensor, the SQUID and the magnetic shield are cooled by heat conduction through the heat conducting means.

Furthermore, in the beam current meter of the invention, the refrigerator is a pulse tube refrigerator.

Moreover, in the beam current meter of the invention, a heater is arranged close to the SQUID in the vacuum vessel, whereby a temperature of the SQUID is made to be constant.

Still further, in the beam current meter of the invention, a magnetism magnetic shield is arranged so as to surround the magnetic shield in the vacuum vessel.

Yet further, in the beam current meter of the invention, a magnetism magnetic shield is arranged so as to surround the vacuum vessel.

Advantageous Effects of the Invention

Since the present invention is constituted as described above, it exhibits such excellent advantageous effects to be possible to simplify the cooling mechanism of a super conductor, and to reduce significantly the cost therefor.

Further, since the present invention is constituted as described above, it exhibits such excellent advantageous effects to be possible to simplify the measurement work, and to reduce the time required for the measurement.

Moreover, since the present invention is constituted as described above, it exhibits such excellent advantageous effects to be possible to improve the magnetic shield performance, and to measure a beam current with high sensitivity.

BRIEF DESCRIPTION OF THE DRAWINGS

FIG. 11 is a block constitutional view showing a constitution of a SQUID feedback circuit.

Figure 1:
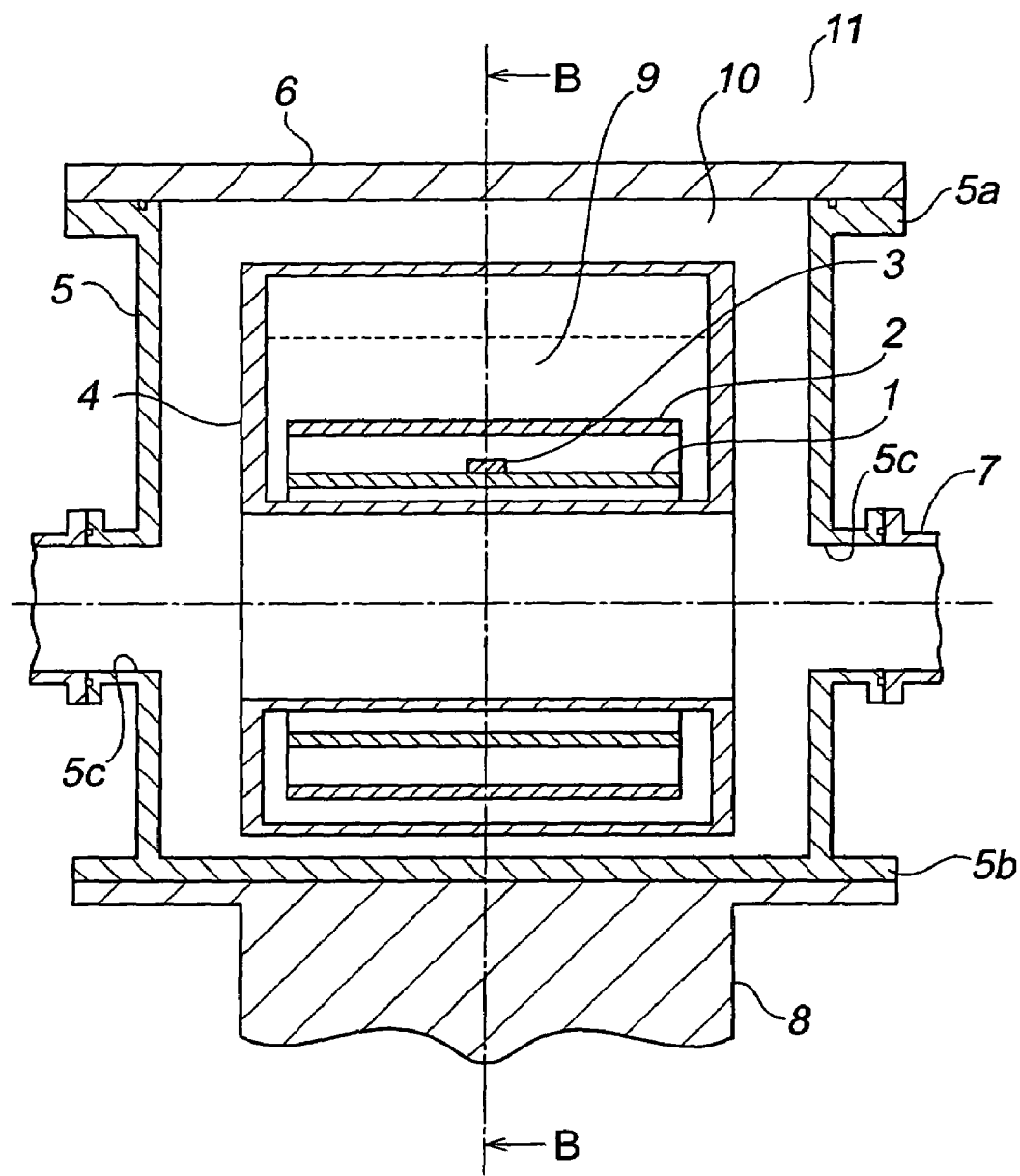
FIG. 1 is a sectional explanatory view showing a schematic constitution of a conventional beam current meter wherein a SQUID and a superconductor magnetic shield operated at liquid helium temperature are used wherein the sectional view is taken along the line A-A of FIG. 2.

EXPLANATION OF REFERENCE CHARACTERS 1 beam current sensor
1$a$ substrate
1$b$ superconductor film
2 magnetic shield
2$a$ substrate
2$b$ superconductor film
3 SQUID
4 cooling medium tank
5, 5' vacuum vessel
5$a$, 5'$a$ top end surface
5$b$, 5'$b$ bottom
5$c$, 5'$c$ throughhole
6, 6' upper flange
6'$a$ opening
7 beam duct
8 trestle
9 liquid helium
10 vacuum area
11 atmospheric air area
12 pulse tube refrigerator
12$a$ cold head
12$b$ valve motor
12$c$ gas compressor
12$d$ gas piping
12$e$ gas piping
12$f$ cold finger
13 cooling plate
14 supporting plate
15 braided conductor
16 heat conductive sheet
17 clamping bolt
18 nut
19 disc spring
20 heat insulation supporting rod
21 rubber cushion
22 electric heater
23 magnetism first magnetic shield
23$a$ disc part
23$b$ cylindrical part
24 magnetism second magnetic shield
24$a$ throughhole
25 chimney shield
26 magnetism third magnetic shield
26$a$ throughhole 27 chimney shield
28 superconductor magnetic shield end plate
28$a$ substrate
28$b$ superconductor film In the following, an example of an embodiment of the beam current meter according to the present invention will be described in detail by referring to the accompanying drawings.

As described above, the same or equivalent components as or to that appeared in the description of the specification or the accompanying drawings are represented by the same reference characters, respectively, whereby an overlapped explanation as to the constitutions and functions of the invention is omitted.

Figure 7:
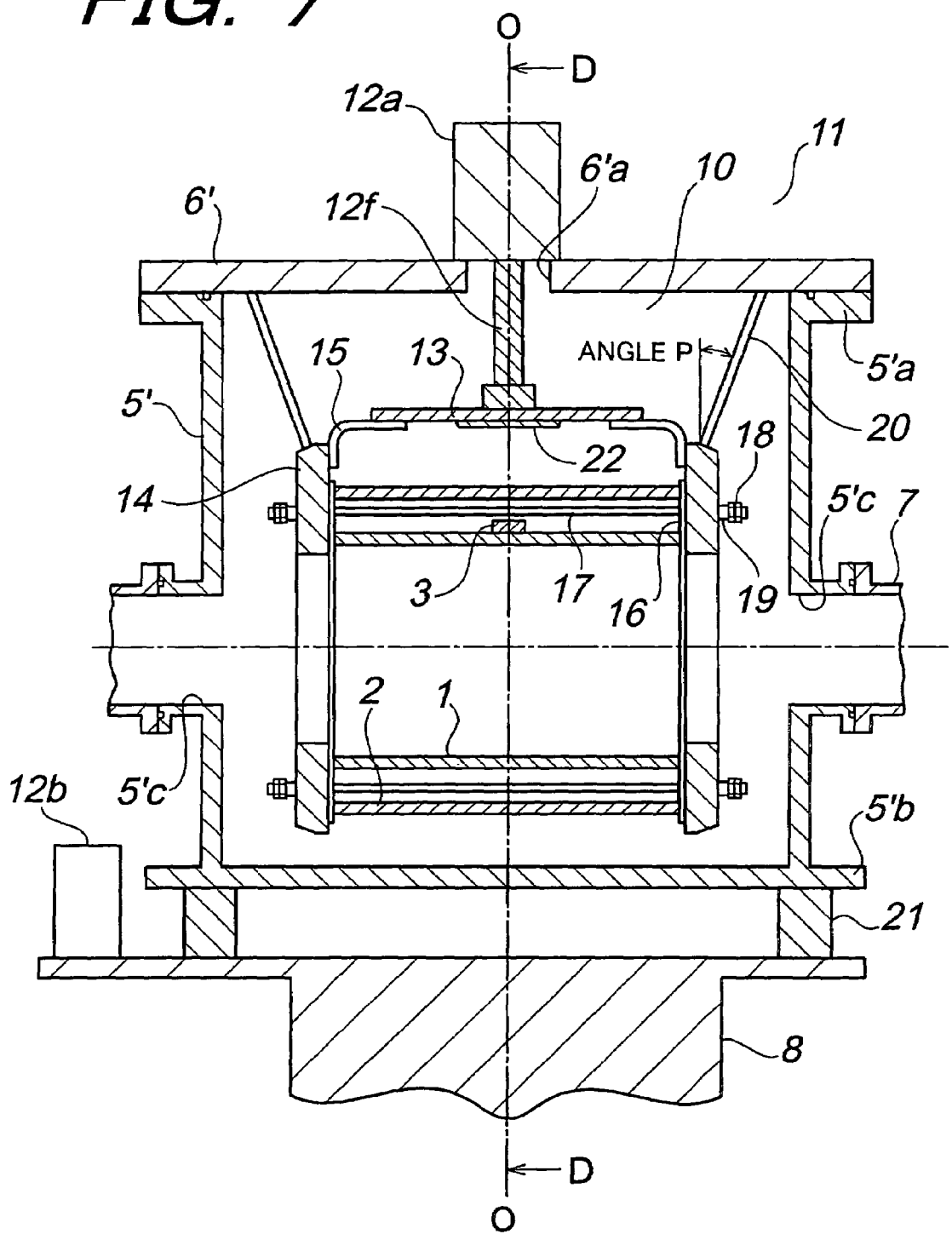
FIG. 7 is a sectional explanatory view showing a schematic constitution of a beam current meter according to one example of an embodiment of the present invention wherein the sectional view is taken along the line C-C of FIG. 8 and the line E-E of FIG. 9.
Figure 8:
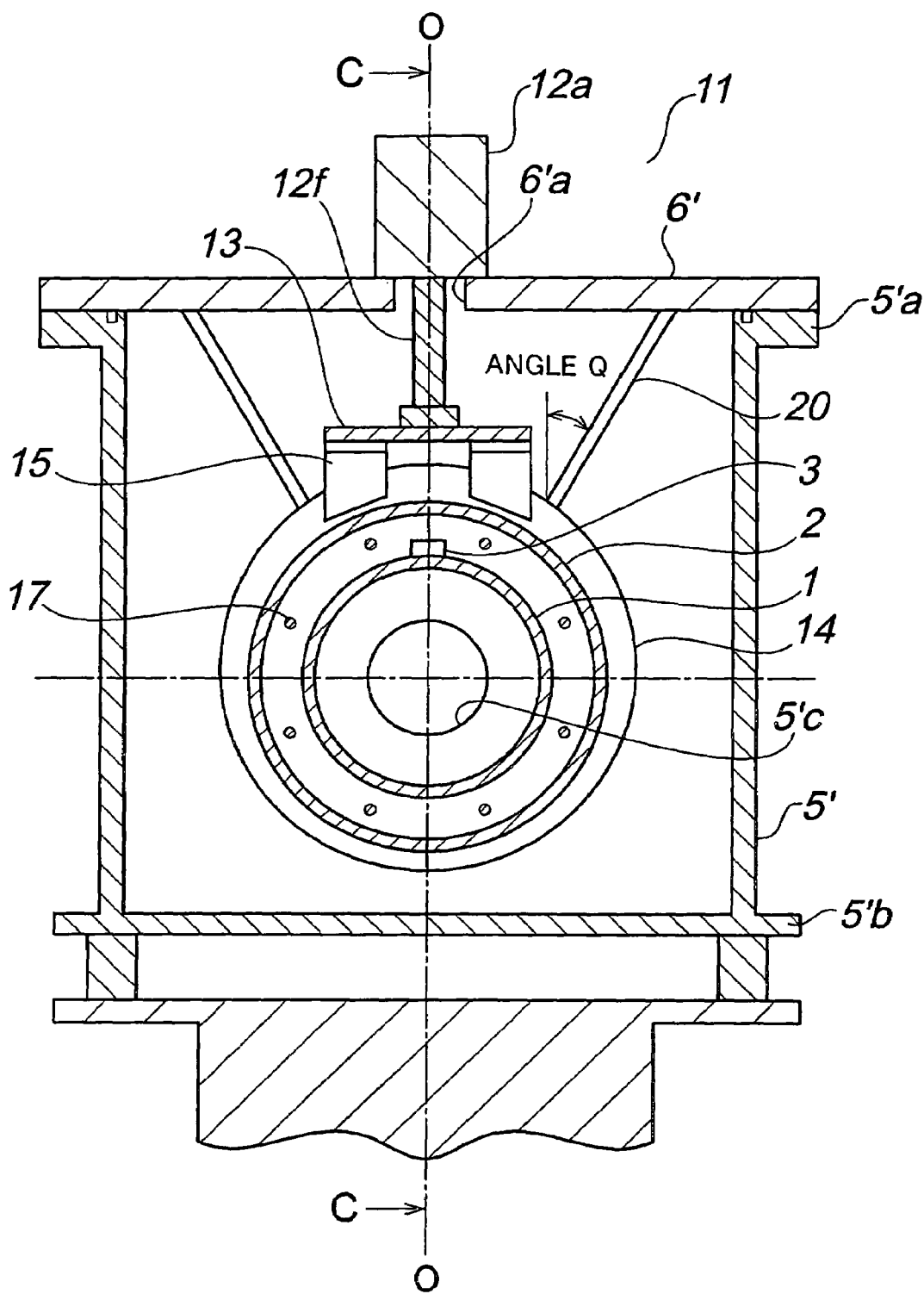
FIG. 8 is a sectional explanatory view showing a schematic constitution of the beam current meter according to the one example of the embodiment of the present invention wherein the sectional view is taken along the line D-D of FIG. 7.
Figure 9:
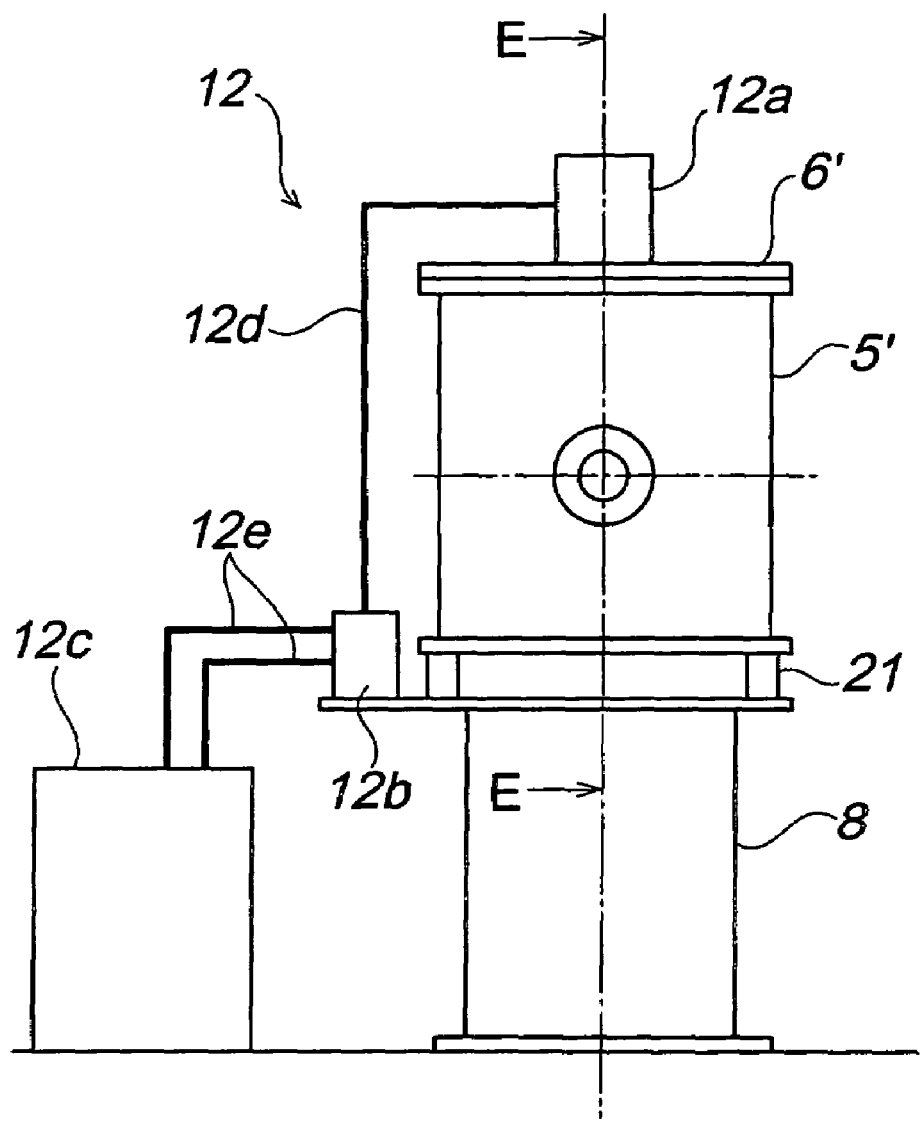
FIG. 9 is a constitutional explanatory view showing the beam current meter according to the one example of the embodiment of the present invention which is a schematic exterior appearance view showing the whole constitution including a layout of a freezing device.

FIGS. 7, 8, and 9 show a constitutional schematic structure of a beam current meter according to one example of an embodiment of the present invention, respectively, wherein FIG. 7 is a sectional view taken along the line C-C of FIG. 8 and that taken along the line E-E of FIG. 9, FIG. 8 is a sectional view taken along the line D-D of FIG. 7, and FIG. 9 is a schematic external appearance view showing the whole constitution including a layout of a freezing device. Moreover, FIG. 7 corresponds to FIG. 1, while FIG. 8 corresponds to FIG. 2.

In FIGS. 7 through 9, a vacuum vessel 5' is constituted as a heat insulation vacuum vessel wherein the side of a top end surface 5'$a$ of the vacuum vessel 5' is closed by an upper flange 6' on which an opening 6'$a$ is defined. As mentioned below, a cold finger 12$f$ connected to a cold head 12$a$ of a pulse tube refrigerator 12 is inserted into the vacuum vessel 5' from the opening 6'$a$.

Namely, reference character 12 designates the pulse tube refrigerator as a refrigerator for cooling a beam current sensor 1, a SQUID 3 and a magnetic shield 2, reference character 12$a$ designates a cold head as a heat conducting means for the pulse tube refrigerator 12, reference character 12$f$ designates a cold finger as the heat conducting means for the pulse tube refrigerator 12, and the cold finger 12$f$ connected to the cold head 12$a$ is inserted into the vacuum vessel 5' through the opening 6'$a$ of the vacuum vessel 5'.

Furthermore, reference character 12$b$ designates a valve motor of the pulse tube refrigerator 12 disposed on a trestle 8, reference character 12$c$ designates a gas compressor for the pulse tube refrigerator 12, reference character 12$d$ designates a gas piping for the pulse tube refrigerator 12, reference character 12$e$ designates a gas piping for the pulse tube refrigerator 12, reference character 12$f$ designates the cold finger connected to the cold head 12$a$ as described above, reference character 13 designates a cooling plate connected to the cold finger 12$f$ and functioning as the heat conducting means cooled by heat conduction from the cold head 12$a$ through the cold finger 12, reference character 14 designates a pair of supporting plates formed in a doughnut-shaped for supporting the beam current sensor 1 and the magnetic shield 2, reference character 15 designates a mechanically flexible braided conductor arranged for connecting the cooling plate 13 with the supporting plate 14 to assure heat conduction, reference character 16 designates heat conduction sheets positioned between the pairs of the supporting plates 14 and both end surfaces of the beam current sensor 1 as well as the magnetic shield 2, respectively, to decrease thermal resistance, reference character 17 designates clamping bolts for coupling the pair of supporting plates 14 to each other, reference character 18 designates nuts for fixing the clamping volts 17 to the supporting plates 14, reference character 19 designates either of disc springs disposed between either of the supporting plates 14 and either of the nuts, reference character 20 designates a heat insulation supporting rod an end of which is secured to an inner wall side of the vacuum vessel 5', while the other end of which is secured to either of the supporting plates 14, thereby arranging the supporting plate 14 at a predetermined position in the vacuum vessel 5' to secure it, reference character 21 designates a rubber cushion disposed between the trestle 8 and the bottom 5'b of the vacuum vessel 5', and reference character 22 designates an electric heater attached to the cooling plate 13 at a position close to the SQUID 3, respectively.

Reference character 5'c designates a throughhole for forming a beam duct 7 at opposed positions in a circumferential wall surface.

Although it is not shown, a criogenic cable for joining the SQUID 3 to a controller (not shown) is connected to the atmospheric air side through a vacuum-tight flange. In order to minimize electrical noise comes to be mixed in signals, control signals are digitized between a route extending from a controller to a feedback circuit (see FIG. 11) and it is arranged in such that communication is made through an optical fiber cable.

As described above, the electric heater 22 is provided on the cooling plate 13 at a position close to the SQUID 3. Since the SQUID 3 requires a degree of stability of several mK or less, a temperature of the SQUID 3 is controlled so as to become constant by controlling a heating amount of the electric heater 22. More specifically, a temperature sensor (not shown) is provided on the cooling plate 13 together with the electric heater wherein a temperature controller (not shown) for controlling a heating amount of the electric heater 22 feedbacks heat to an electric current value in the electric heater 22 based on temperature information from the temperature sensor, whereby stabilization of a temperature of the SQUID 3 is intended. In order to realize high stabilization of a temperature in the SQUID 3, for example, a PID (Proportional plus Integral plus Derivative) control may be applied as a temperature controller.

More specifically, the bottom 5' side of the vacuum vessel 5' is supported on the trestle 8 through the rubber cushion 21.

In the beam current meter, it is arranged in such that a beam is incoming into a beam duct through either of throughholes 5'c constituting either of the beam ducts 7 and it is outgoing through the other throughhole 5'c constituting the other beam duct 7.

Inside the vacuum vessel 5', the cylindrical beam current sensor 1 is arranged in such a manner that a beam incoming into the vacuum vessel 5' is guided to pass through a bore of the vacuum vessel, and the SQUID 3 is disposed on the upper surface side of the beam current sensor 1. Moreover, a cylindrical superconductor magnetic shield 2 is arranged so as to surround the external diameter side of the beam current sensor 1 in such a manner that the SQUID 3 is positioned between the beam current sensor 1 and the magnetic shield 2.

The opposite ends of the magnetic shield 2 on which the above-described beam current sensor 1 and the SQUID 3 are disposed are supported by the pair of doughnut-shaped supporting plates 14, respectively, and the pair of the supporting plates 14 are clamped by the clamping bolts 17 and the nuts 18, whereby the magnetic shield 2 on which the beam current sensor 1 and the SQUID 3 are disposed is associated with the supporting plates 14.

The thus associated magnetic shield 2 on which the beam current sensor 1 and the SQUID 3 are disposed, and the supporting plates 14 are arranged in the vacuum vessel 5' through the heat insulation supporting rods 20 in such a positional relation that a beam incoming into the vacuum vessel 5' is guided to pass through the bore of the beam current sensor 1 and a space on the inner diameter side of the supporting plates 14. Specifically, either end of the heat insulation supporting rod 20 is fixed to the inner wall surface of the vacuum vessel 5', while the other end of the heat insulation supporting rod 20 is secured to the supporting plate 14. Two each of the heat insulation rods 20 are arranged to each of the supporting plates 14. In FIG. 7, the heat insulation rod is inclined outwards by an angle P with respect to the centerline O-O (the angle P is preferably 10 degrees or more), while the heat insulation rod is inclined outwards by an angle Q with respect to the centerline O-O (the angle Q is preferably 10 degrees or more) in FIG. 8.

Furthermore, the supporting plate 14 is connected to the cooling plate through the braided conductor 15, and it is arranged in such that the supporting plate 14, the beam current sensor 1, the magnetic shield 2, and the SQUID 3 are cooled by heat conduction from the cooling plate 13 linked to the cold head 12a through the cold finger 12f.

Since the supporting plate 14 functions to support mechanically and to make heat conductive cooling with respect to the beam current sensor 1 and the magnetic shield 2, it is preferred that the supporting plate is made from a material having high mechanical strength and good heat conductivity, for example, copper and the like.

Moreover, it is preferred that an oil compound or Apiezon grease which has good heat conductivity even at a low temperature is filled in a contact area of the cold head 12a, the cold finger 12f, the cooling plate 13, the braided conductors 15, the supporting plates 14, the heat conductive sheets 16, the beam current sensor 1, the magnetic shield, and the SQUID 3, respectively.

In the above-described constitution, the interior of the vacuum vessel 5' is maintained in $1 \times 10^{-4}$ Pa by vacuum equipment (not shown), and a beam is passed through the beam current meter. More specifically, it is arranged in such that the beam is guided to input from either of the throughhole 5'c constituting either of the beam ducts 7 and to output from the other throughhole 5c constituting the other beam duct 7, thereby measuring a beam current of the beam.

A measuring principle of such beam current meter using the beam current sensor 1 and the SQUID 3 is the same as that explained in the above-described paragraphs "Background of the Invention and the Prior Art", so that the description is quoted herein and the explanation thereof is omitted.

In the above-described beam current meter according to the example of the embodiment of the present invention, the current sensor 1, the magnetic shield 2 and the SQUID 3 are disposed in vacuum, and the current sensor 1, the magnetic shield 2 and the SQUID 3 are cooled by heat conduction from the cold head 12a and the cold finger 12f being a heat conducting means of the pulse tube refrigerator 12.

Figure 2:
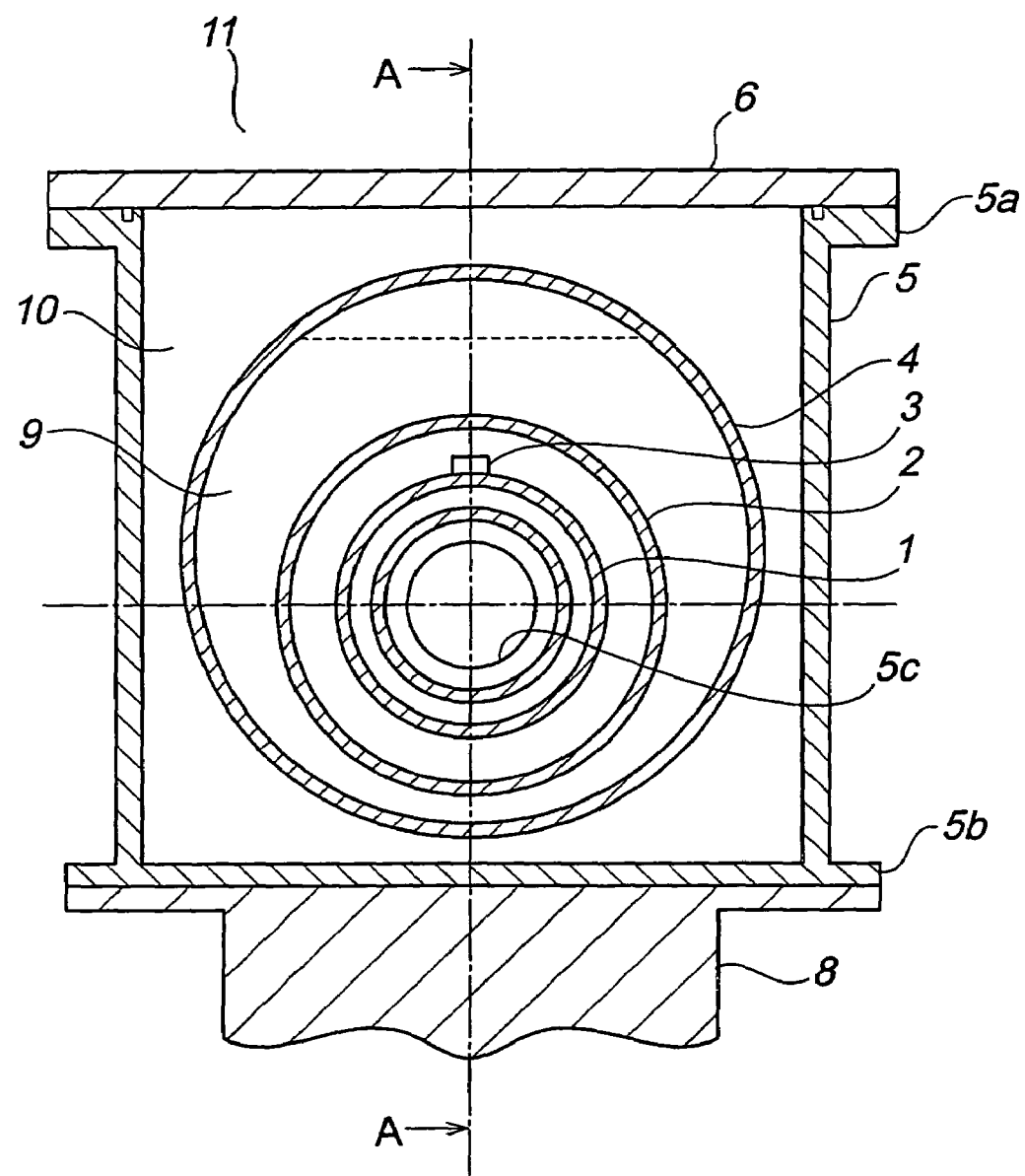
FIG. 2 is a sectional explanatory view showing a schematic constitution of the conventional beam current meter wherein the SQUID and the superconductor magnetic shield operated at liquid helium temperature are used wherein the sectional view is taken along the line B-B of FIG. 1.
Figure 3:
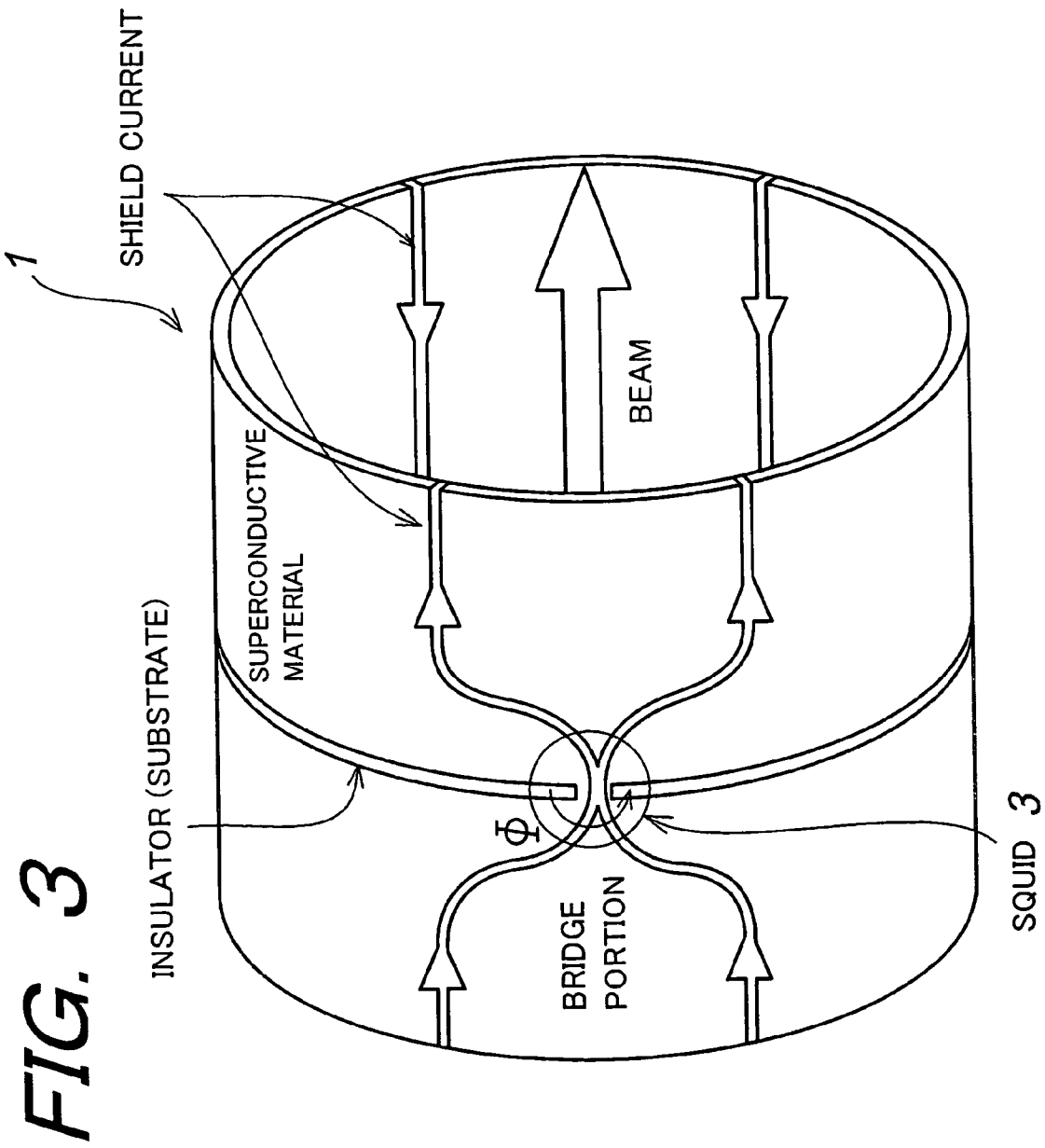
FIG. 3 is a perspective explanatory view showing a schematic constitution of a beam current sensor provided with a SQUID.
Figure 4:
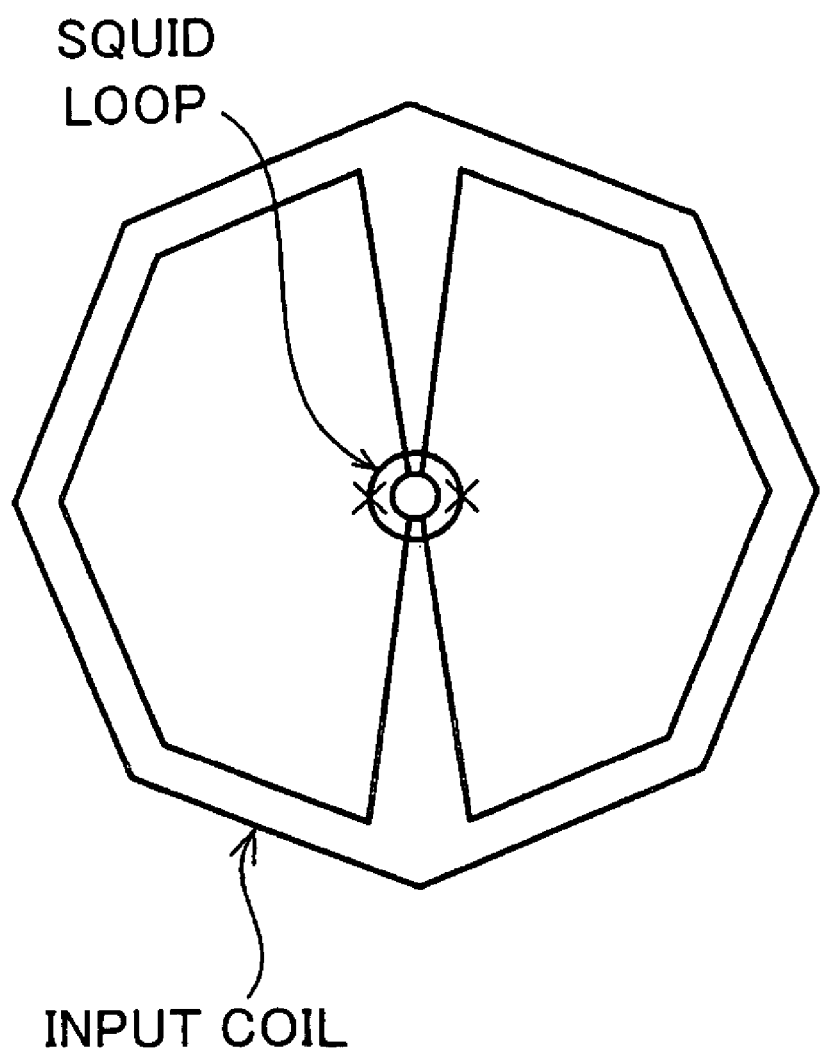
FIG. 4 is an explanatory view showing a SQUID gradiometer.
Figure 5:
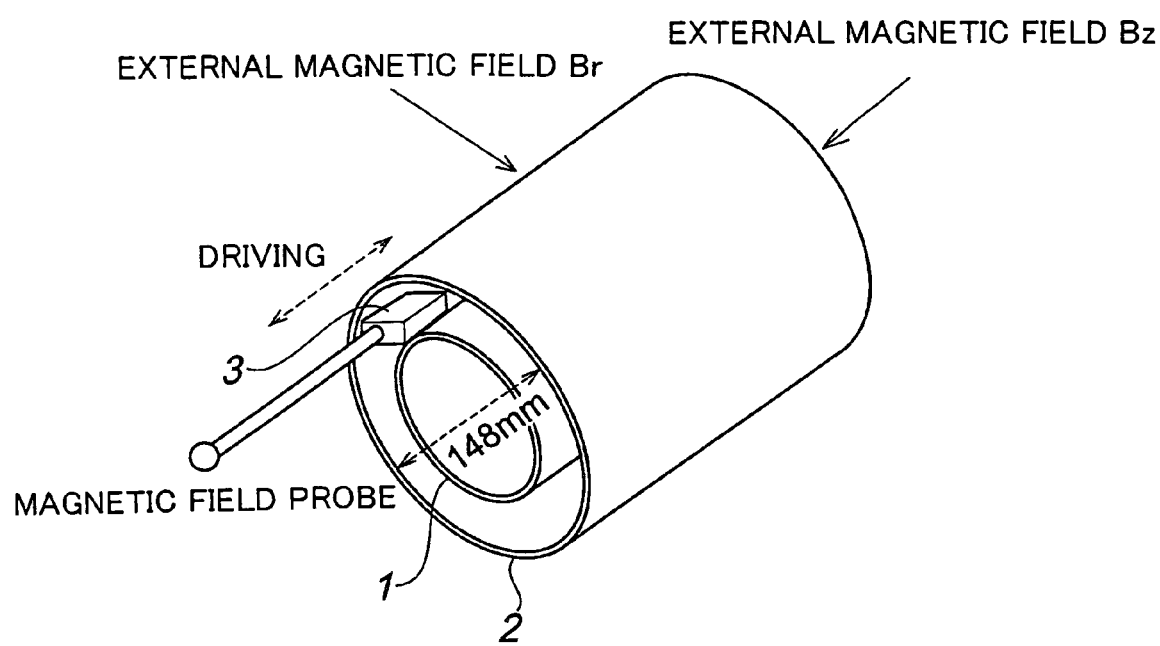
FIG. 5 is an explanatory view showing a SQUID system to measure a magnetic field for measuring effects of a magnetic shield.
Figure 6:
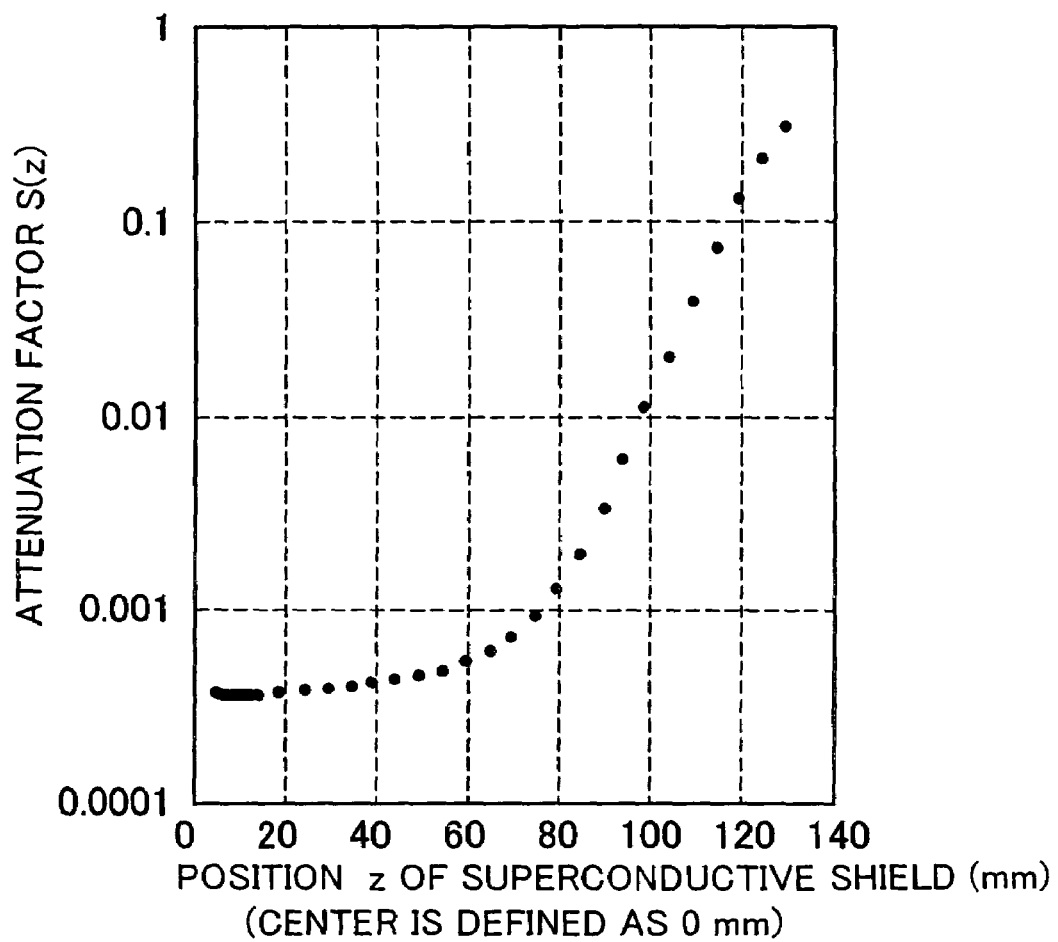
FIG. 6 is a graph indicating attenuation factors of a magnetic field with the use of the SQUID system shown in FIG. 5.

Namely, there is no need to use liquid helium or liquid nitrogen for cooling the current sensor 1, the magnetic shield 2, and the SQUID 3, so that the cooling medium tank 4 and the like for storing a cooling medium as shown in FIG. 1 come to be not required, whereby the cooling mechanism is simplified, and the manufacturing cost can be reduced significantly.

In addition, since liquid helium itself is expensive, it may be achieved to reduce the cost in view of that such an expensive cooling medium is not required to use.

Besides, since there is no work for replenishing liquid helium or liquid nitrogen as a cooling medium, instability in the SQUID in case of replenishing the liquid helium or the liquid nitrogen can be excluded, whereby the measurement work is simplified, and a time required for the measurement can be shortened.

In the beam current meter according to the example of the embodiment of the invention, the pulse tube refrigerator 12 which includes no operating parts in a refrigeration producing section is used as a refrigerator being the cooling means for cooling the current sensor 1, the magnetic shield 2, and the SQUID 3 in order to minimize vibration noise received by the current sensor 1, the magnetic shield 2, and the SQUID 3.

In addition, for the sake of suppressing vibration noise received by the current sensor 1, the magnetic shield 2, and the SQUID 3, the valve motor 12b is placed on the trestle 8, and the rubber cushion 21 is positioned between the trestle 8 and the vacuum vessel 5', whereby transmission of mechanical vibration of the valve motor 12b to the current sensor 1, the magnetic shield 2, and the SQUID 3 is prevented. Besides, the cooling plate 13 and the supporting plates 14 are linked through the mechanically flexible braided conductors 15, whereby mechanical vibration transmitted from the cold head 12a, the cold finger 12, and the cooling plate 13 to the current sensor 1, the magnetic shield 2, and the SQUID 3 is reduced.

The pulse tube refrigerator 12 used in the embodiment operates with, for example, 5.5 Hz pumping cycle, and in this respect, it is preferred to calculate a characteristic frequency of the whole system by employing the pumping cycle with which the pulse tube refrigerator 12 operates as excitation frequency, and to select the rubber cushion 21 having a suitable spring multiplier factor in such that both the frequencies do not coincide with each other.

In the above-described beam current meter according to the example of the embodiment of the present invention, the disc spring 19 is disposed between the clamping bolt and the supporting plate 14 for absorbing excessive force produced in the clamping bolt 18 and avoiding to produce loosening in the clamping bolt due to cooldown and heat shrinkage, whereby clamping strength of the clamping bolt is elevated. Moreover, the supporting plates 14 are supported by two each of the heat insulation supporting rods 20 wherein the angles P and Q being inclined angles in case of fitting the heat insulation supporting rods are to be 10 degrees or more, respectively, whereby support rigidity in the horizontal direction is increased to decrease generation of mechanical vibration.

Since it is arranged in such that the cold head 12a is supported by the upper flange 6', the assembly and disassembly thereof can be easily carried out.

As described above, the beam current meter according to the example of the embodiment of the invention is arranged in such that a temperature of the SQUID 3 is kept constant by controlling a heating amount of the electric heater provided on the cooling plate 13.

Figure 10:
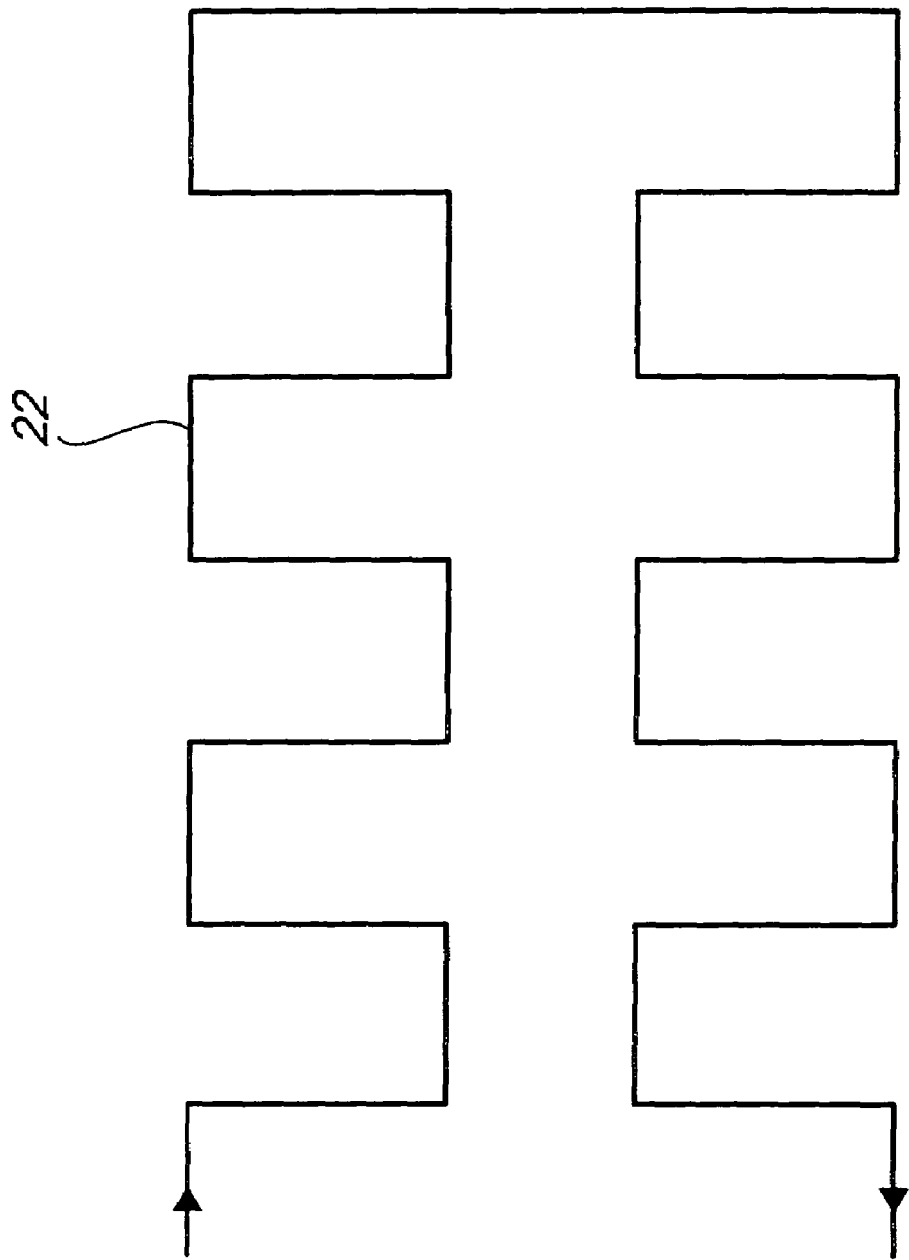
FIG. 10 is a schematic diagram showing an electric current of an electric heater.

The electric heater 22 will be described by referring to FIG. 10 being an electric current schematic diagram of the electric heater 22.

The electric heater 22 is constituted as a so-called film heater wherein when an electric current is flowed through the electric heater 22, a magnetic field appears and it acts as disturbance noise with respect to the SQUID 3. In the present embodiment, two film heaters are superposed to constitute the electric heater 22, directions of electric currents flowing through the upper and lower film heaters are reversed to each other, whereby generation of a magnetic field from the electric heater is reduced.

As to operations of the SQUID 3, when an electric current is applied across opposite ends of the SQUID, no voltage appears up to the critical current value Ic, because no resistance exists. However, when the electric current exceeds the critical current value Ic, resistance appears. The critical current value Ic behaves in such that a magnetic flux $\Phi$ striking through the SQUID varies COS-functionally with taking a flux quantum $\Phi_0$ unit (h/2e=$2.068 \times 10^{-15}$ Weber) as a cycle.

As described above, since an output of the SQUID is non-linear, it cannot be used for general-purpose magnetic field measurement without any modification. Hence, a feedback circuit shown in FIG. 11 is commonly used. The SQUID is magnetically coupled with a pickup coil, an input coil, a feedback coil, and a modulation coil. First, a magnetic field B induced by the pickup coil is transmitted to the input coil, whereby opposite voltages of the SQUID are going to change. In this case, however, an electric current is applied to the feedback coil in the feedback circuit so as to cancel the changed portion. This action is the same as that of a principle of negative feedback PLL (Phase Locked Loop). When a voltage of the feedback current (an output in FIG. 11) is measured, it becomes possible to measure a magnetic field of the pickup. The modulation circuit in FIG. 11 is used for broaden a frequency band.

Figure 12:
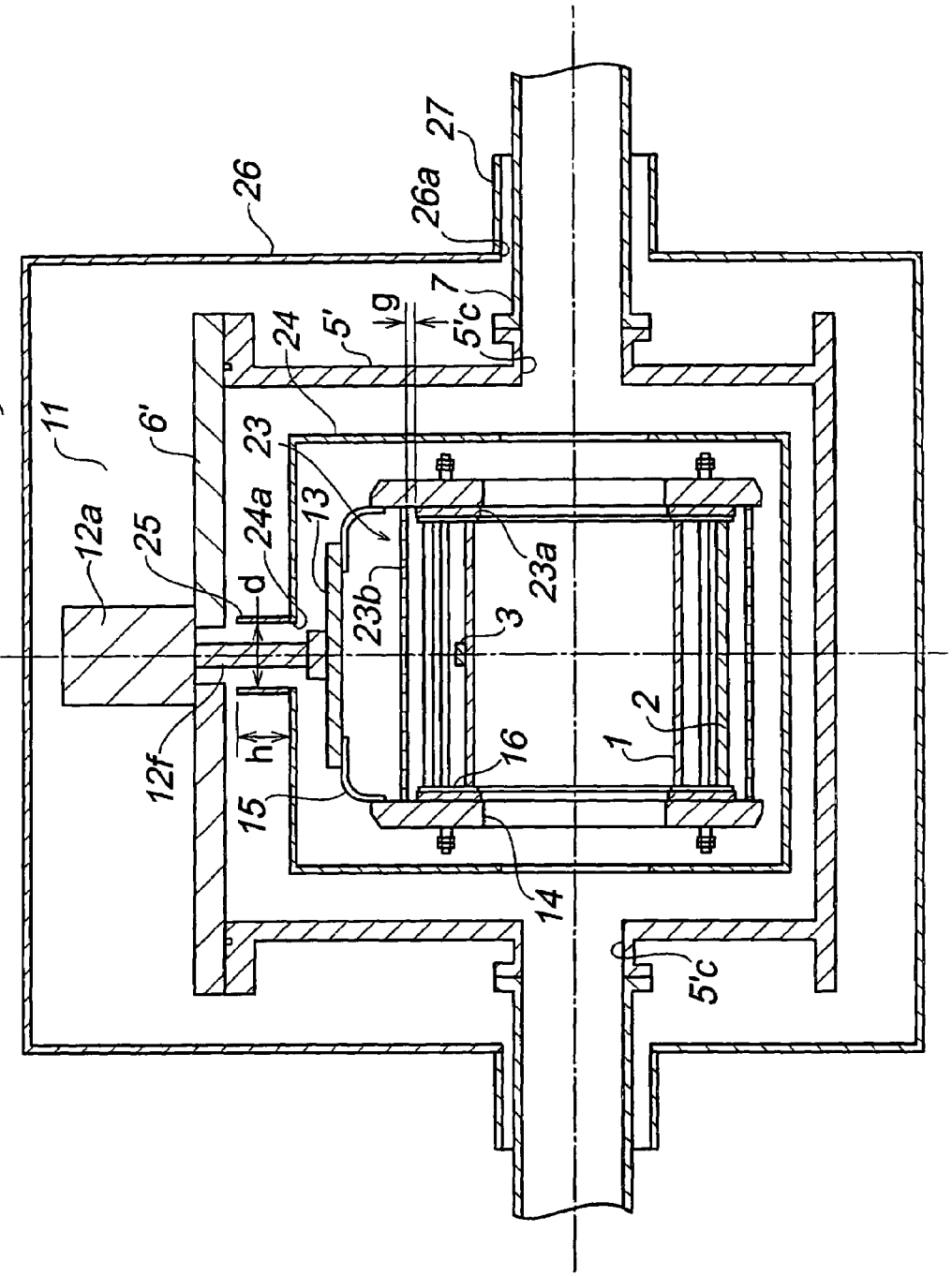
FIG. 12 is a sectional explanatory view of a schematic constitution showing another embodiment of the beam current meter according to the present invention which is a sectional view corresponding to that of FIG. 1 and FIG. 7.

Next, the beam current meter of another embodiment according to the present invention will be described by referring to FIG. 12 wherein FIG. 12 is a sectional view corresponding to that of FIGS. 1 and 7.

The beam current meter shown in FIG. 12 is provided with a plurality of magnetism magnetic shields each made from a high-permeability material in order to increase magnetic shield performance.

Namely, in FIG. 12, reference character 23 designates a magnetism first magnetic shield, reference character 23a designates a disc part of the magnetism first magnetic shield 23, reference character 23b designates a cylindrical part of the magnetism first magnetic shield 23, reference character 24 designates a magnetism second magnetic shield, reference character 25 designates a chimney shield, reference character 26 designates a magnetism third magnetic shield, and reference character 27 designates a chimney shield.

More specifically, the magnetism first magnetic shield 23 composed of the disc part 23a and the cylindrical part 23b is disposed close to the magnetic shield 2. Specifically, the disc part 23a of the magnetism first magnetic shield 23 is disposed between the supporting plate 14 and ends of the current sensor 1 and the magnetic shield 2, while the cylindrical part 23b of the magnetism first magnetic shield 23 is arranged in such that the circumferential part of the magnetism first magnetic shield is positioned between the magnetic shield 2 and the cooling plate 13.

As described above, since the magnetism first magnetic shield 23 composed of the disc part 23a and the cylindrical part 23b is located close to the magnetic shield 2, magnetic shield performance can be improved with respect to the SQUID 3 wherein when a gap g is provided between the disc part 23a and the cylindrical part 23b, the magnetic shield performance can be further elevated. In this case, it is preferred that the gap g is, for example, 0.5 mm or more.

The magnetism second magnetic shield 24 is provided so as to cover the respective constitutional members in a vacuum vessel 5' including the current sensor 1, the magnetic shield 2, the SQUID 3 and the supporting plates 14 which are associated by joining a pair of the supporting plates 14 with these components; a cooling plate, and a braided conductors 15.

As a result of providing such magnetism second magnetic shield 24, the magnetic shield performance can be more elevated.

In addition, since the magnetism first magnetic shield 23 and the magnetism second magnetic shield 24 are located in the vacuum vessel 5', the whole system can be formed into a compact apparatus, and further an amount of the magnetic materials to be used can be reduced.

Next, the magnetism third magnetic shield 26 is located in atmospheric air so as to cover the whole vacuum vessel 5'.

The provision of such magnetism third magnetic shield 26 as described above results in more elevated magnetic shield performance.

Incidentally, since superconductive magnetic shield has poor shield performance with respect to an external magnetic field in right angle direction with respect to the cylindrical axis, a throughhole 24a for passing a cold finger 12f in the magnetism second magnetic shield 24 therethrough causes decrease in the magnetic shield performance. In this respect, when the chimney shield 25 is provided as a magnetism magnetic shield which is formed risingly with an extension from the throughhole 24a to the cold finger 12f, the influence of decrease in magnetic shield performance by the throughhole 24a can be reduced wherein it is preferred that a ratio h/d being that of a diameter d of the chimney shield, i.e. a diameter of the throughhole 24 and a height h thereof is made to be 1 or more.

In a similar fashion, a chimney shield 27 may be provided as a magnetism magnetic shield extending along the beam duct 7 on a throughhole 26a passing through the beam duct 7 in the magnetism third magnetic shield 26.

Shield performance with respect to electric wave can be further elevated by adhesively bonding a high conductive material to or plating the above-described magnetism first magnetic shield 23, the magnetism second magnetic shield 24, the chimney shield 25, the magnetism third magnetic shield 26, and the chimney shield 27.

Figure 13:
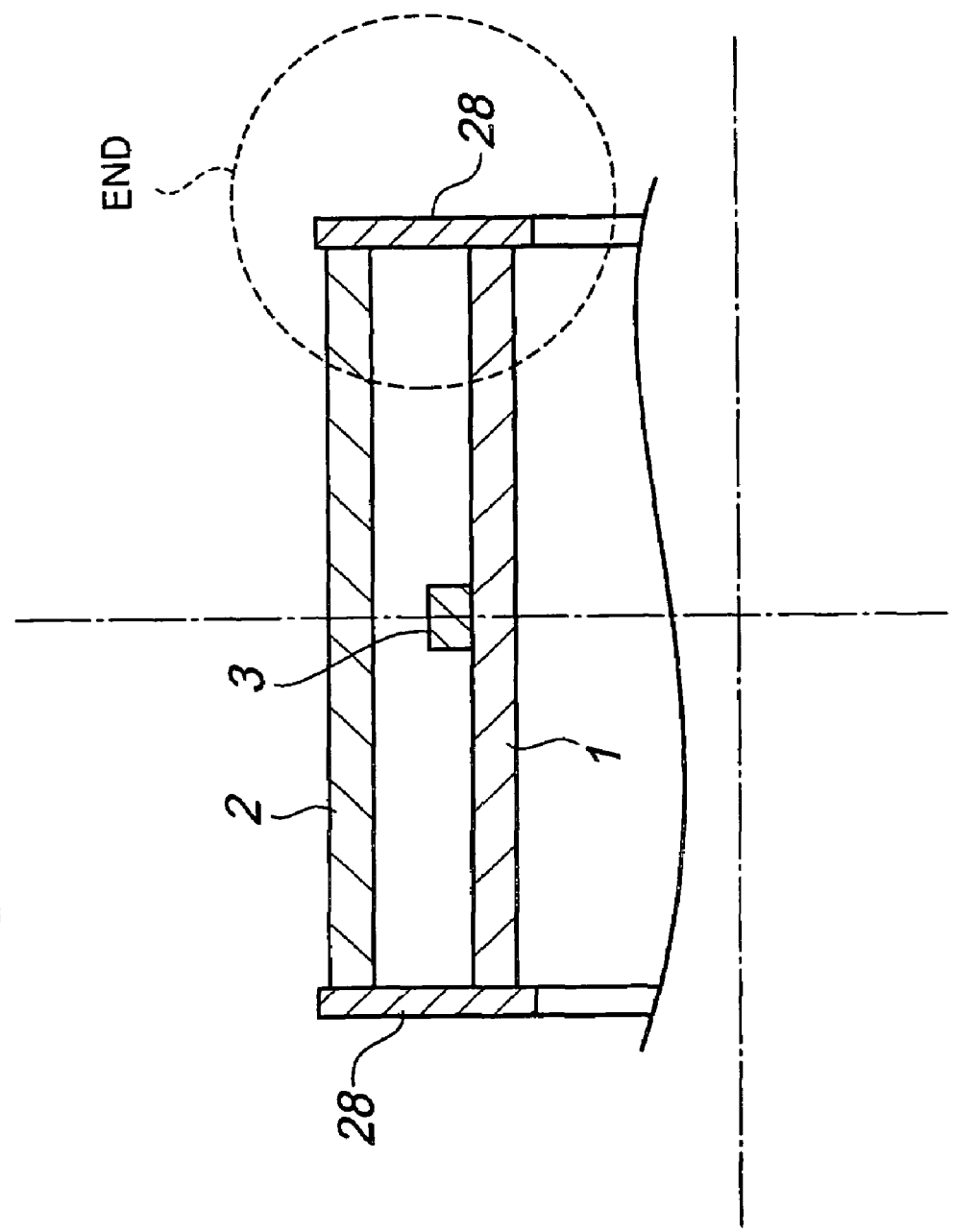
FIG. 13 is a schematic constitutional explanatory view showing another embodiment of the beam current meter according to the present invention.
Figure 14:
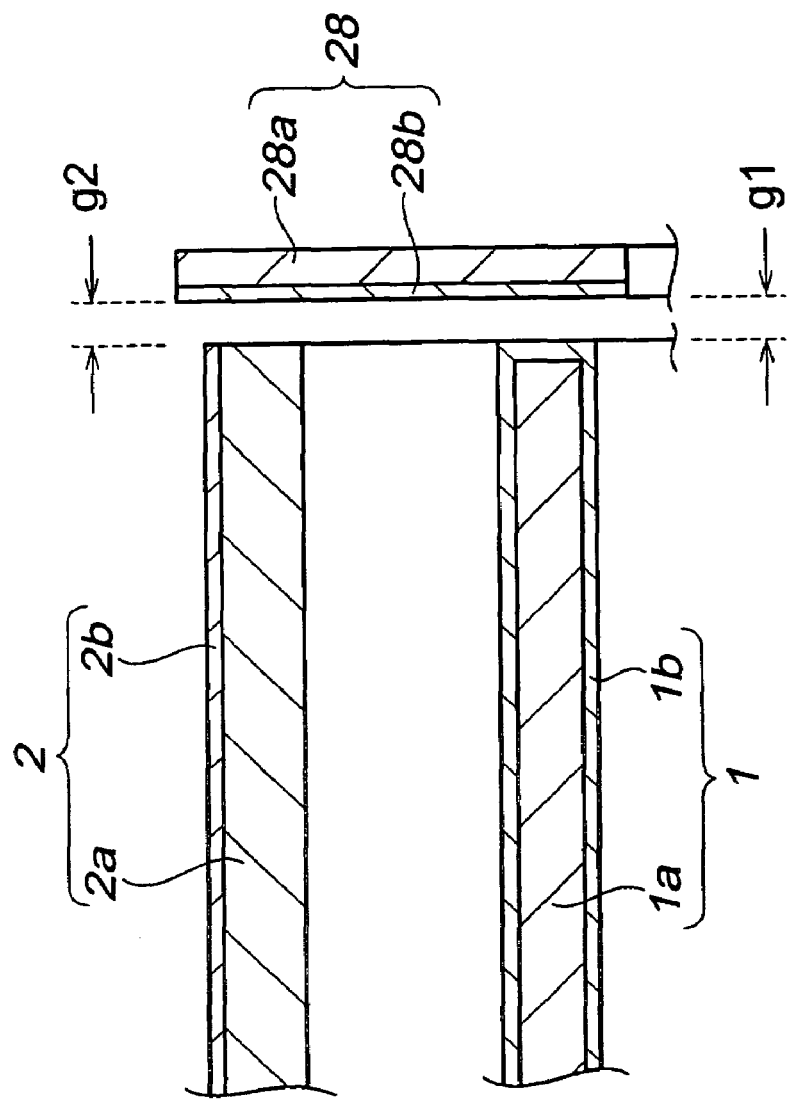
FIG. 14 is an enlarged conceptual sectional view of the end portion shown by a circular broken line in FIG. 13.
Figure 15:
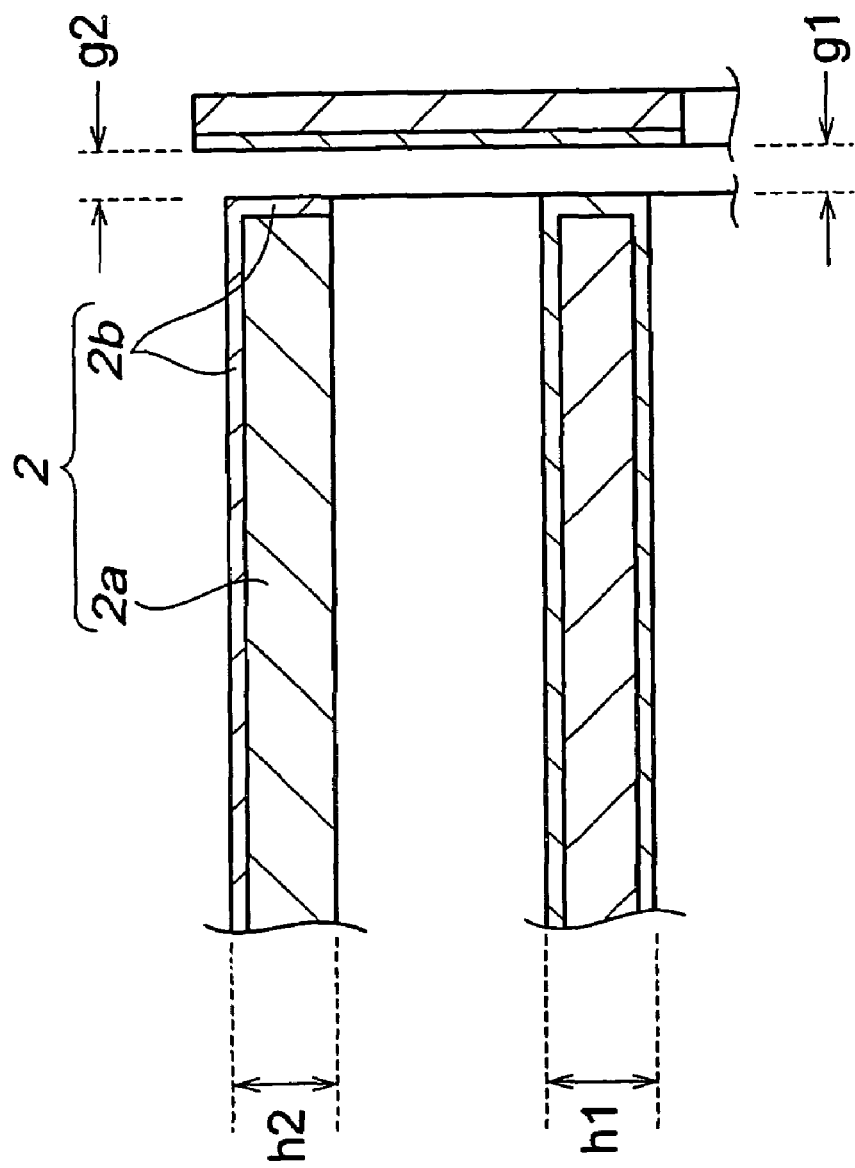
FIG. 15 is an enlarged conceptual sectional view showing another embodiment of the beam current meter according to the present invention wherein the sectional view corresponds to FIG. 14.

Next, FIGS. 13 through 15 show the beam current meter according to a further embodiment of the present invention wherein magnetic shield performance of a superconductor magnetic shield itself can be improved.

More specifically, superconductor magnetic shield end plates 28 are provided on both opposite ends of current sensor 1 and a magnetic shield 2, respectively, in the embodiment shown in FIG. 13. When such superconductor magnetic shield end plates 28 as described above are provided, the magnetic shield performance can be elevated.

FIG. 14 is an enlarged conceptual sectional view showing the end portion encircled by a circular broken line in FIG. 13.

It is difficult to prepare all of the current sensor 1 and the magnetic shield 2 from superconductor in view of the manufacturability and the cost. Thus, a film of the superconductor is formed on a ceramic or metal substrate in general as shown in FIG. 14.

Namely, in FIG. 14, reference character 1a designates a substrate (ceramics or a metal is used usually) of the current sensor 1, and reference character 1b designates a film of superconductor wherein the current sensor 1 is constituted by bonding the superconductor film 1b to the substrate 1a. The superconductor film 1b of the current sensor 1 is formed on an inner diameter circumferential wall surface, end surfaces, and an outer diameter circumferential wall surface of the substrate 1a of a cylindrical shape for measuring a beam current.

Further, reference character 2a designates a substrate (ceramics or a metal is usually used) of a magnetic shield, reference character 2b designates a superconductor film, and a magnetic shield 2 is constituted by bonding the superconductor film 2b to the substrate 2a wherein the superconductor film 2b of the magnetic shield 2 is formed only on an outer diameter circumferential wall surface of the substrate 2a of a cylindrical shape.

In a similar fashion, reference character 28a designates a substrate (ceramics or a metal is usually used) of the superconductor magnetic shield end plate 28, reference character 28b designates a superconductor film wherein the superconductor magnetic shield end plate 28 is constituted by bonding the superconductor film 28b to the substrate 28a. The superconductor film 28b of the superconductor magnetic shield end plate 28 is formed on only either side (a surface opposed to the end surfaces of the current sensor 1 and the magnetic shield 2) of the substrate 28a of a doughnut shape.

A film thickness of the superconductor films 1b, 2b, and 28b is, for example, around 0.1 mm, respectively.

There is such a fear that gaps g1 and g2 exist in between the ends of the current sensor 1 as well as magnetic shield 2 and the superconductor magnetic shield end plate 28 due to errors in the manufacturing process. When such gaps g1 and g2 exist, it becomes difficult to elevate magnetic shield performance. For instance, even when 0.5 mm each of the gaps g1 and g2 appears, increase in magnetic shield performance is slight.

In order to improve such decrease in the magnetic shield performance accompanied with existence in the gaps g1 and g2 as shown in FIG. 14, a superconductor 2b may be formed also on an end surface opposed to the superconductor magnetic shield end plate 28 of the magnetic shield 2 as shown in FIG. 15.

Moreover, when g1/h1 being a ratio of the gap g1 and a thickness h1 of the current sensor 1, and g2/h2 being a ratio of the gap g2 and a thickness h2 of the magnetic shield 2 are adapted to be ¹⁄₁₀ or less, respectively, elevation of the magnetic shield performance can be achieved.

The above-described embodiments may be modified into the following paragraphs (1) through (6) as explained therein.

(1) In the above-described embodiments, although a type of the super conductor constituting the current sensor 1, the magnetic shield 2, and the SQUID 3 is not specifically limited, either of a low-temperature superconductor operating at a low temperature (liquid helium temperature) or a high-temperature superconductor operating at a high temperature (liquid nitrogen temperature) may be used as the superconductor constituting the current sensor 1, the magnetic shield 2, and the SQUID 3.

(2) In the above-described embodiments, although shapes of the current sensor 1 and the magnetic shield 2 are circular cylinder shapes, the invention is not limited thereto as a matter of course. Namely, it is sufficient that the current sensor 1 and the magnetic shield 2 have a cylindrical shape, so that the shape may be an elliptical cylinder or a polygonal cylinder shapes other than the circular cylinder shape.

In this connection, the doughnut shape in the supporting plate 14 may be appropriately modified so as to fit to a cylindrical shape of the current sensor 1 and the magnetic shield 2.

(3) In the above-described embodiments, although two each of the heat insulation supporting rods 20 are provided on each of the supporting plates 14, the invention is not limited thereto as a matter of course. One each of the heat insulation supporting rod 20 may be provided on each of the supporting plates 14, or three or more each of the heat insulation supporting rods may be provided on each of the supporting plates. Furthermore, the number of the heat insulation supporting rod(s) 20 to be provided on either of the supporting plates 14 may differ from that of the heat insulation supporting rod(s) 20 to be provided on the other supporting plate 14.

(4) In the above-described embodiments shown in FIG. 12, although all the components of the magnetism first magnetic shield 23, the magnetism second magnetic shield 24, the chimney shield 25, the magnetism third magnetic shield 26, and the chimney shield 27 are provided as illustrated in the figure, all the components are not necessarily provided as a matter of course wherein desired components may be properly selected from the components of the magnetism first magnetic shield 23, the magnetism second magnetic shield 24, the chimney shield 25, the magnetism third magnetic shield 26, and the chimney shield 27. Besides, both of the disc part 23*a* and the cylindrical part 23*b* are not necessarily provided with respect to the magnetism first magnetic shield 23, but either of them may be provided.

(5) In the above-described embodiments, although a pulse tube refrigerator is used as a refrigerator being a cooling means for cooling the current sensor 1, the magnetic shield 2, and the SQUID 3 in order to decrease mechanical vibration, the invention is not limited thereto, but a refrigerator containing a mechanical driving device in the cold head section may be used in the case where influences of mechanical vibration come to be not a problem.

(6) The above-described embodiments and the modifications enumerated in the above-described paragraphs (1) through (5) may be properly combined with each other.

The beam current meter of the invention can be used in the case where a faint beam current of around several nA is measured with high precision and in a nondestructive condition.

The invention claimed is:

1. A beam current meter including a cylindrical superconductor beam current sensor arranged in a vacuum vessel in such a manner that the beam incoming into the vacuum vessel is guided to pass through a bore of the vacuum vessel and a bridge portion is formed at the outer diameter; a SQUID arranged at the bridge portion of the beam current sensor; a cylindrical superconductor magnetic shield arranged so as to surround the external diameter side of the beam current sensor in such a manner that the SQUID is positioned between the beam current sensor and the magnetic shield, so that a beam is guided to pass through the bore of the beam current sensor, thereby measuring the beam current of the beam, characterized by that:

a freezing device is used as a cooling means for cooling the beam current sensor, the SQUID, and the magnetic shield.

2. The beam current meter as claimed in claim 1, characterized by that:

the freezing device is provided with a heat conducting means disposed in the vacuum vessel, and the beam current sensor, the SQUID and the magnetic shield are cooled by heat conduction through the heat conducting means.

3. The beam current meter as claimed in any one of claims 1 and 2, characterized by that:

the refrigerator is a pulse tube refrigerator.

4. The beam current meter as claimed in any one of claims 1, 2 and 3, characterized by that:

a heater is arranged close to the SQUID in the vacuum vessel, whereby a temperature of the SQUID is made to be constant.

5. The beam current meter as claimed in any one of claims 1, 2, 3 and 4, characterized by that:

a magnetism magnetic shield is arranged so as to surround the magnetic shield in the vacuum vessel.

6. The beam current meter as claimed in any one of claims 1, 2, 3 and 4, characterized by that:

a magnetism magnetic shield is arranged so as to surround the vacuum vessel.

* * * * *